United States Patent [19]

Hibino et al.

[11] Patent Number: 4,844,465
[45] Date of Patent: Jul. 4, 1989

[54] ADAPTOR OF A CARTRIDGE FOR GAMING MACHINE
[75] Inventors: Toshiro Hibino; Yoshihiro Inoue, both of Kyoto, Japan
[73] Assignee: Nintendo Company, Ltd., Kyoto
[21] Appl. No.: 39,300
[22] Filed: Apr. 17, 1987
[30] Foreign Application Priority Data Jul. 11, 1986 [JP]  Japan ................................ 61-266079

[51] Int. Cl.⁴ .............................................. A63F 9/22
[52] U.S. Cl. ................................. 273/148 B; 273/1 E
[58] Field of Search ........... 273/148 B, 1 E, DIG. 28; 174/50.52, 50.54, 52 R; 360/94; 361/395, 399

[56] References Cited
U.S. PATENT DOCUMENTS

4,114,044  9/1978  Chiulli ............................. 273/148 B
4,149,027  4/1979  Asher et al. ................ 273/DIG. 28
4,480,835  11/1984 Williams .......................... 273/148 B
4,531,176  7/1985  Beecher, II .......................... 361/395
4,596,390  6/1986  Studley ........................... 273/148 B

Primary Examiner—Leo P. Picard
Assistant Examiner—Jessica J. Harrison
Attorney, Agent, or Firm—Nixon & Vanderhye

[57] ABSTRACT

An adaptor for an electronic gaming machine cartridge which will enable the use of a cartridge of a particular configuration to be used in a gaming machine designed to operate with a cartridge of a different configuration. The adaptor includes a case having a main portion which houses a connector board and an edge connector for electrically interconnecting the connecting board and a circuit board in the cartridge. The case also includes a pair of guide supports which extend aft of the main portion in a spaced parallel relation and act to support the cartridge. The adaptor further includes structure for preventing the cartridge from being inserted in the adaptor upside down and further structure for preventing the adaptor itself from being inserted upside down in the gaming machine.

17 Claims, 8 Drawing Sheets

ADAPTOR OF A CARTRIDGE FOR GAMING MACHINE

BACKGROUND OF THE INVENTION

1. Field of the Invention

The present invention relates to an adaptor for a cartridge for a gaming machine and particularly to a device for adapting a gaming machine cartridge of a particular configuration for use with a gaming machine intended to be used with a cartridge of another configuration.

2. Description of the Prior Art

A processing apparatus such as a home television game or a personal computer (for example, a product known by the trade name MSX) uses a replaceable memory cartridge (or other replaceable cartridge) containing a memory (for example, a ROM or a battery-backed-up RAM) which stores a program of software such as a game, quiz or education program, so that a CPU incorporated in the processing apparatus executes desired processing to display a result (or a process) of the processing. Such cartridges and processing apparatus are disclosed for example in Japanese Patent Laying-Open No. 2834/1979 (counterpart U.S. patent application Ser. No. 801,240 with the priority date May 27, 1977) and Japanese Patent Laying-Open No. 112352/1984 (counterpart U.S. patent application Ser. No. 261,361 with the priority date May 7, 1981). Any of the processing apparatus disclosed in those documents has an insertion opening on its upper surface for inserting a portion, typically a lower portion, of a cartridge. Also, an edge connector is contained in a lower portion of the insertion opening. When a ROM cartridge is inserted downward into the insertion opening and is held in the edge connector, the cartridge is loaded into the main body of th processing apparatus. Such a system for loading a cartridge vertically into a main body of a processing apparatus is hereinafter referred to as a vertical loading system.

DESCRIPTION OF THE RELATED ART

Figure 12A:
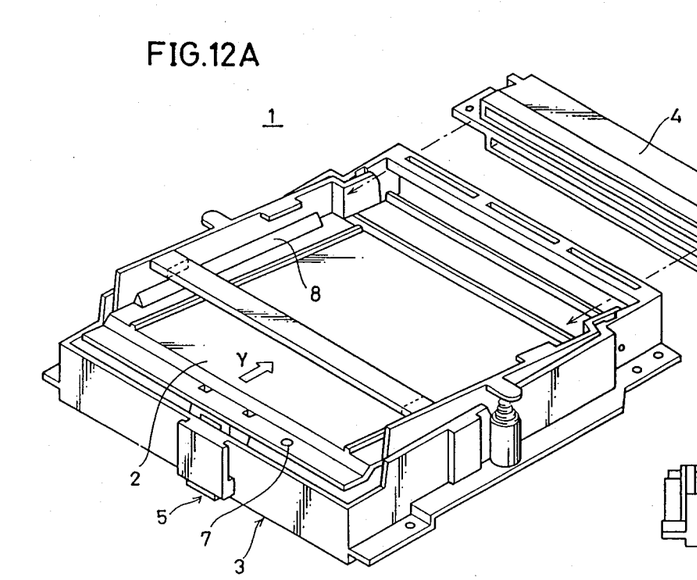
FIG. 12A is a perspective view thereof and FIG. 12B is a front view thereof, partially in section.

Prior to the filing of this application, the Applicant of the present invention disclosed a system for loading a cartridge into the front face of a main body of a gaming machine in Japanese Patent Application No. 190372/1985 (corresponding to U.S. patent application Ser. No. 900,717 filed Aug. 27, 1986, and EPC Application No. 86,306,646). In this system, an insertion opening for a cartridge is formed in the front face of the main body of a gaming machine and a front loading device 1 as shown in FIG. 12A is provided within the insertion opening. Such a loading device is illustrated in more detail in FIGS. 12A and 12B herein. Referring to those figures, front loading device 1 has a cartridge receiving tray 2 mounted on frame 3. An edge connector 4 is located at the inner end of the tray 2 to provide an electrical interconnection between the printed circuit board in the cartridge and a second circuit board mounted in the main body. The cartridge is loaded by inserting it in the tray and then rotating the tray downward into an operating position where it is secured by a releaseable lock mechanism. Such a system for loading a cartridge into the front face of the main body of a processing apparatus is hereinafter referred to as a front loading system.

Such gaming machines do not have any unified standard for memory cartridge configurations and manufacturers utilize various cartridges. In addition, even gaming machines made by the same company use different cartridge configurations depending on the loading system. As a result, when users want to use cartridges of a configuration different from that which their gaming machines were designed for, they must buy a new gaming machine adapted to use such cartridges, which increases costs the users have to pay. In addition, such lack of interchangeability, even among products of the same company, is not desirable for manufacturers or dealers because they cannot give good service to users and because it increases manufacturing costs.

Under the circumstances, it would be very convenient to employ an adaptor which would permit the use of a cartridge of a particular configuration in a gaming machine designed to be used with a cartridge of a different configuration.

SUMMARY OF THE INVENTION

Therefore, a primary object of the present invention is to provide an adaptor for a cartridge for a gaming machine which permits interchangeability among cartridges for gaming machines of different types.

Another object of the present invention is to provide an adaptor capable of loading, reliably and and with stability, a cartridge for a gaming machine of a specified type into a gaming machine of another type.

Briefly stated, the present invention is a device for adapting a cartridge for a first gaming machine to be used with a second gaming machine intended for use with a cartridge of a different configuration. This adaptor includes a connection board and a connector enclosed in a case having an upper half and a lower half. A portion of the case is formed to have a shape adapted for the second gaming machine and another portion is formed to receive and support the cartridge for the first gaming machine. Particularly, the case includes a guide support portion which precisely positions the cartridge in the adaptor, and after insertion, supports and stabilizes the cartridge.

Thus, according to the present invention, a cartridge of a certain gaming machine can be loaded reliably and with stability into a gaming machine designed for another cartridge configuration and thus interchangeability of cartridges can be attained. In addition, the present invention insures that the circuit board of the cartridge will be accurately positioned and in firm electrical contact with the connector in the adaptor.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 12A and 12B show an example of a front loading apparatus incorporated in a gaming machine to which the present invention is applied. Particularly.

DESCRIPTION OF THE PREFERRED EMBODIMENTS

Figures 7, 8A, 8B:
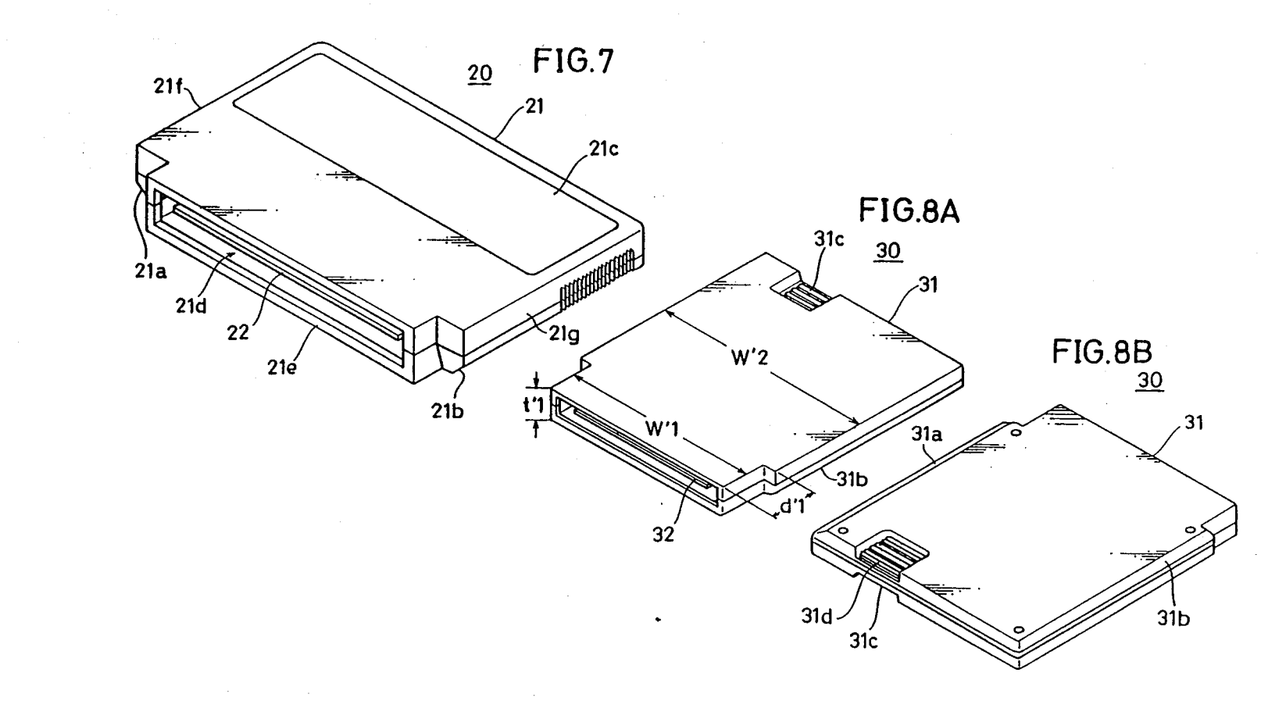
FIG. 7 is a perspective view showing a typical cartridge for a vertical loading system.
FIGS. 8A and 8B are perspective views of the upper and lower surfaces, respectively, of a cartridge for a front loading system.

The adaptor shown in FIGS. 1 to 4 permits the memory cartridge 20 of FIG. 7, designed for a vertical loading system, to be used in the front loading system shown in FIGS. 8A and 8B. Referring first to FIGS. 1 to 4, construction of this embodiment will be described.

Adaptor 10 comprises a case 13 formed by an upper half 11 and a lower half 12, a connection board 14 housed in the case 13, and a two-edge connector 15. The case 13 comprises a main body portion 13a and two guide support portions 13b and 13c which extend aft of the main body portion. The adaptor is configured to receive cartridge 20 in cartridge receiving space 13e which is bounded by the aft end of the main body portion 13a and the inner side faces of the two guide support portions 13b and 13c. The external dimensions of case 13 are substantially equal to the external dimensions of cartridge 30 shown in FIGS. 8A and 8B. Particularly, main body portion 13a includes opposing L-shaped steps L1 and L2 which correspond to steps L1' and L2' of cartridge 30. The widths W1 and W2 of main body portion 13a are substantially equal to widths W'1 and W'2, respectively, of the corresponding portion of cartridge 30 shown in FIG. 8A. A distance dl from the front edge 13d to the shoulders of the steps L1 and L2 is substantially equal to a distance d'1 in the corresponding portion shown in FIG. 8A. A thickness tl of the case 13 is substantially equal to a thickness t'1 of the cartridge 30 as shown in FIG. 8A. In addition, tapered surfaces 13f and 13g are formed in both lower side portions of the lower half 12 of the case 13 corresponding to tapered surfaces 31a and 31b of cartridge 30. Surfaces 13f and 13g serve to prevent the adaptor 10 from being inserted in the main body of the gaming machine upside down. More specifically, the main body of the gaming machine is constructed to receive the cartridge 30 only when the adaptor 10 is inserted with tapered surfaces 13f and 13g being directed downward. An opening 13h is formed in the forward end 13d of the case 1 exposing the forward edge of connection board 14.

Tapered surfaces 13i and 13j are formed on both inner lower side faces of guide support portions 13b and 13c so as to fit tapered surfaces 21a and 21b formed on the two lower side faces of the case 21 of the cartridge 20. As a result, the cartridge 20 cannot be inserted in the adaptor upside down.

Guides 13k and 13l which are formed on the upper surfaces of the guide support portions 13b and 13c serve to guide surface 21c of the cartridge 20 when it is inserted in the receiving space 13e. Accordingly, vertical motion of the cartridge is constrained by guides 13k and 13l and tapered surfaces 13i and 13j, and horizontal motion is constrained by the inner sides of guide support portions 13b and 13c.

Figures 3, 4:
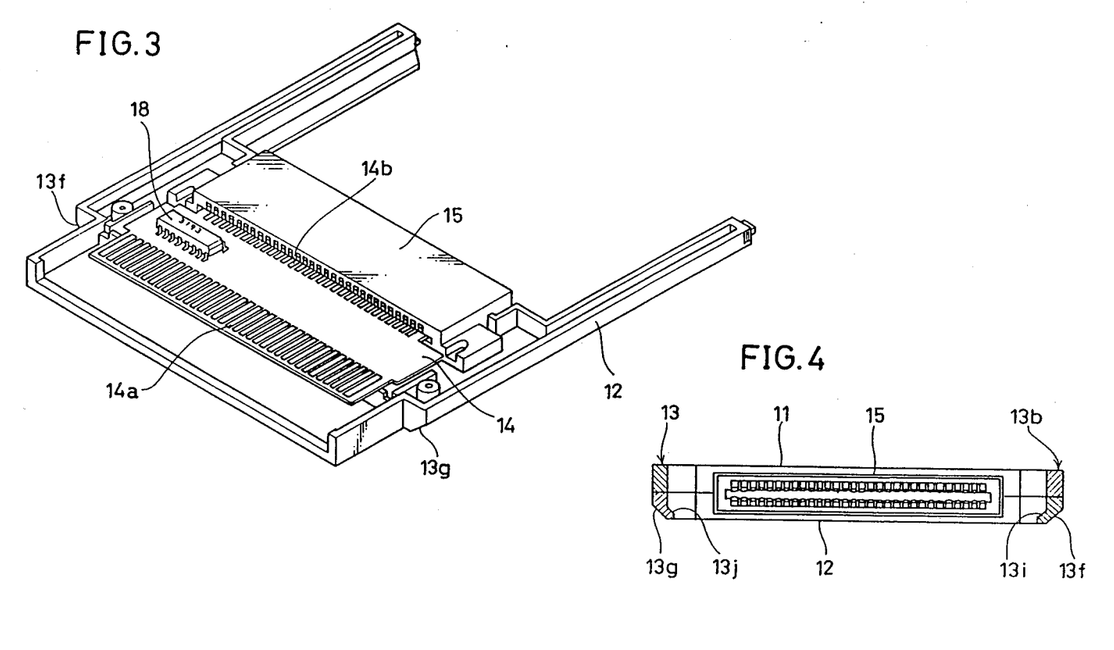
FIG. 3 is a perspective view showing the embodiment of FIG. 1 in which the upper half of the case has been removed.
FIG. 4 is a sectional view taken along the line 4—4 shown in FIG. 1.

Referring to FIG. 3, the connection board 14 has connection terminal groups 14a and 14b disposed on its upper surface near its forward and aft edges, respectively. The shape, the positioning or pitches, and the number of terminals of terminal group 14a is selected to be equal to the number of terminals formed on the circuit board 32 contained in the cartridge 30. Similarly, the terminal group 14b corresponds with the terminals of the circuit board 22 contained in the cartridge 20.

The function of the edge connector is to electrically interconnect circuit boards 14 and 22. One of the insertion openings of the connector 15 receives the aft edge portion of the connection board 14, and the other opening receives the circuit board 22 of the cartridge 20 when the cartridge 20 is inserted. For this purpose, the aft end of the connector is configured to slideably fit in the opening 21d formed at the front edge 21e of the cartridge 20. In assembling the adaptor, the connector and circuit board are secured to lower half 12 with screws and then upper half 11 is attached to the lower half. The halves are joined with screws and also by L-shaped downwardly bent projections at the ends of upper half guide supports 13b and 13c which have holes that interlock with a pair of cooperating projections on the ends of the lower half guide supports. This construction can be seen most clearly in FIG. 2.

Figure 1:
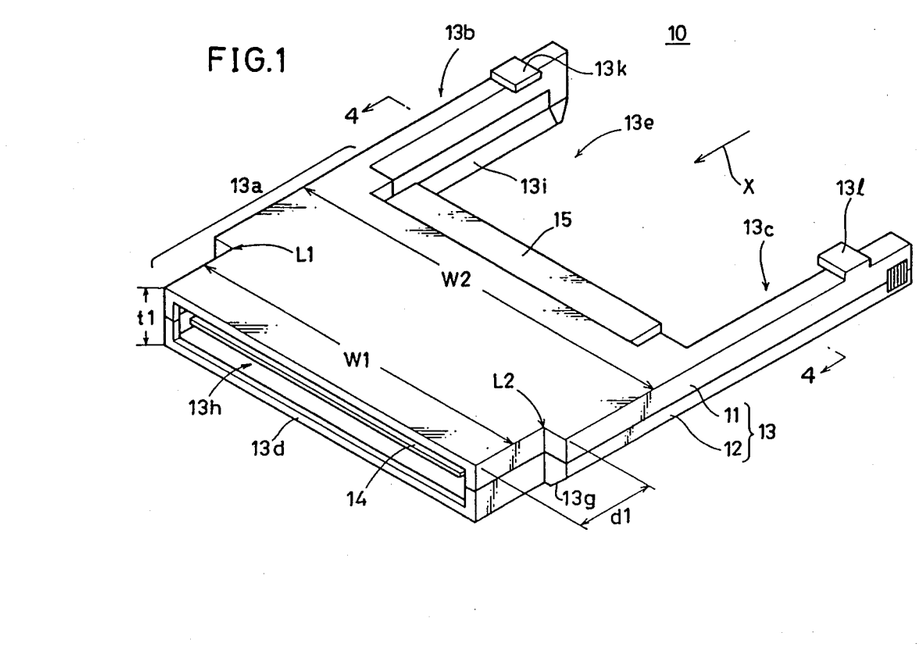
FIG. 1 is a perspective view showing an embodiment of the present invention.

In order to use the adaptor, cartridge 20 is inserted between the guide support portions in the direction of the arrow X shown in FIG. 1 with the front edge 21e of the cartridge 20 being introduced first. The side faces 21f and 21g of the cartridge 20 contact the inner side faces of the guide support portions 13b and 13c, and the upper surface 21c contacts the lower surfaces of the projecting pieces 13k and 31l. Thus, the cartridge 20 is guided by the guide support portions 13b and 13c and the projecting pieces 13k and 13l so that the cartridge 20 can be inserted in the adaptor 10 smoothly and correctly. If the user attempts to insert the cartridge upside down tapered surfaces 13i and 13j of the guide support portions 13b and 13c, respectively, interfere with the cartridge and prevent it from being so inserted.

Figures 5, 6:
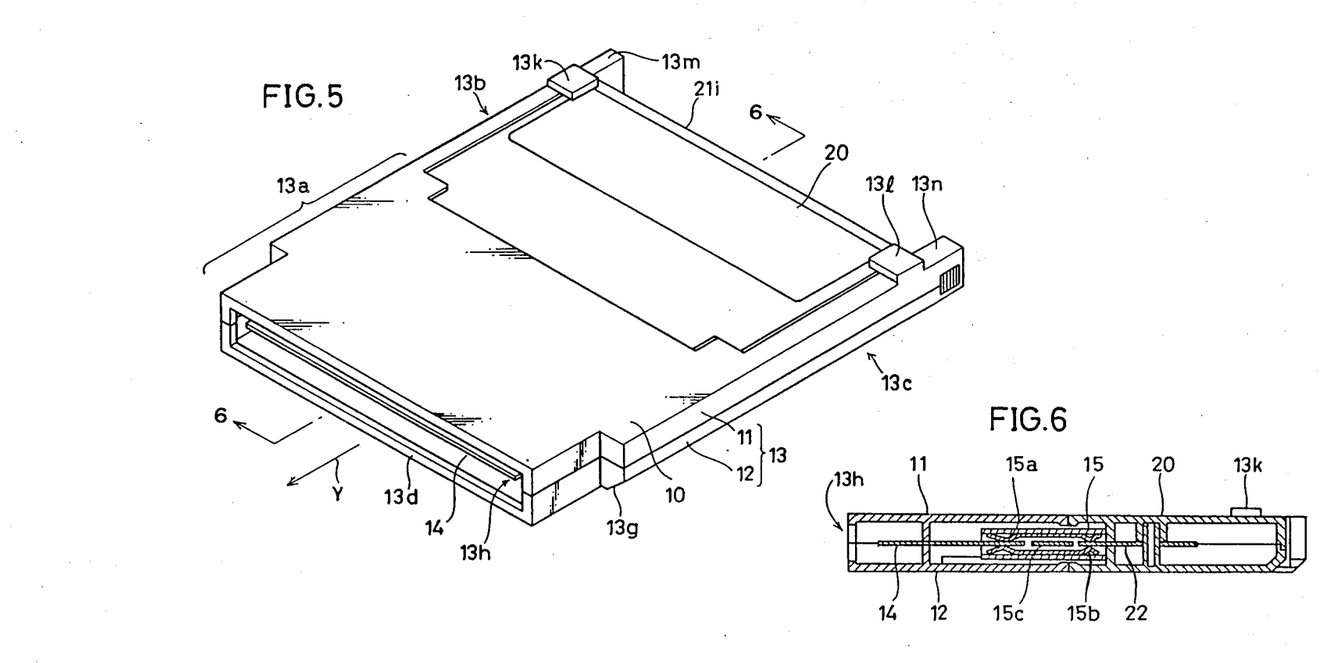
FIG. 5 is a perspective view showing the subject adaptor with a cartridge installed in it.
FIG. 6 is a sectional view taken along the line 6—6 shown in FIG. 5.

FIG. 5 is a perspective view showing the cartridge properly inserted in the adaptor. FIG. 6 is a sectional view taken along the line 6—6 in FIG. 5. As shown, an edge portion of the two-edge connector 15 is fitted in the opening 21d of the cartridge 20 and a portion of the circuit board 22 of the cartridge is inserted in the two-edge connector 15. Upper contact terminals 15a and lower contact terminals 15b are provided in the two-edge connector 15 for the respective terminals of the circuit board 22. The respective ends of the upper and lower contact terminals 15a and 15b are shaped as shown to provide firm stable support for the board and good electrical contact. The resilience of the terminals 15a and 15b serves to support the circuit board 22 and stablize it for reliable interconnection between cartridge 20 and the connector 15. A spacing member 15c is provided in a central portion of the two-edge connector 15 so as to provide a suitable space between the boards.

As is evident from FIGS. 5 and 6, the cartridge 20 is supported by the two-edge connector 15, the inner side faces of the guide support portions 13b and 13c and the lower surfaces of the projecting pieces 13k and 13l.

Thus, vertical motion of the cartridge with respect to the adaptor is substantially prevented and the chances of damage to the contacts is minimized.

As shown in FIGS. 8A and 8B, recessed portions 31c and 31d are formed on the upper and lower surfaces, respectively, of cas 31 of the cartridge 30. Those recesses serve as grasping points for the fingers when the cartridge 30 is to be inserted in or removed from the main body of the gaming machine.

Figure 12B:
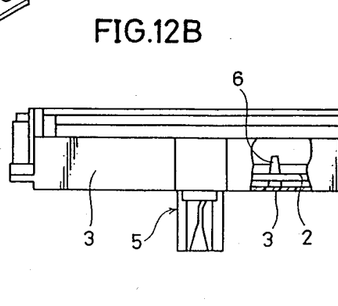

Recess 31d also cooperates mechanically with front loading device 1 to prevent the loading of an unauthorized cartridge. Referring to FIGS. 12A and 12B, it can be seen that projection 6 extends upward from frame 3 and that hole 7 is located in tray 2 just above the projection. When the cartridge is inserted in the tray and the tray is rotated downward into a level or operating position, the projection will extend through the hole and into the recess. If a user attempts to load a cartridge not having an appropriately positioned and dimensioned recess, projection 6 will strike the cartridge case and prevent rotation of the tray into the operating position. Thus, only a cartridge compatible with these features can be inserted, and the authenticity of the cartridge is mechanically determined. When adaptor 10 and cartridge 20 are loaded, projection 6 passes to the rear of end 21i of the cartridge. As a result, the loading of the adaptor and cartridge is not prevented by the projection 6.

Referring to FIGS. 5 and 12A, the adaptor 10 with cartridge 20 installed is inserted in the front loading device of the main body of the gaming machine along the direction of the arrow Y with the front edge 13d thereof being inserted first. If the adaptor 10 is inserted upside down, wedge-shaped member 8 in the tray obstructs the insertion of the adaptor 10 and thus an inverted insertion of the adaptor can be prevented.

Figure 9:
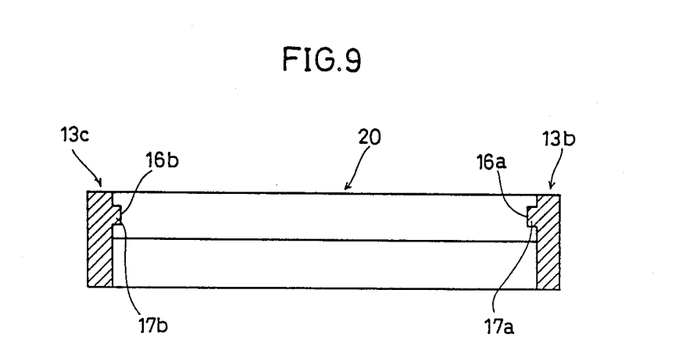
FIGS. 9 and 10 show two additional embodiments of the present invention.
Figure 10:
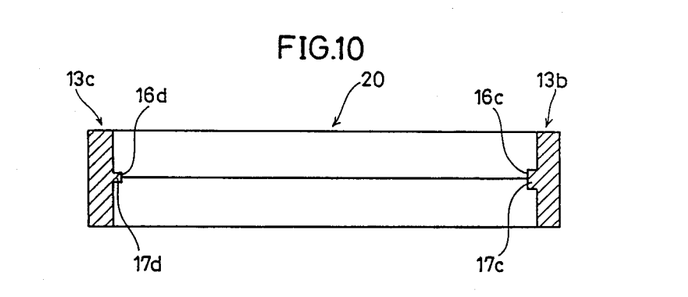

In the above described embodiment, tapered surfaces 21a and 21b are formed in the cartridge 20 and corresponding tapered surfaces 13i and 13j are formed in the guide support portions 13b and 13c so that the cartridge 20 cannot be inserted in the adaptor 10 upside down. However, other means may be used to prevent an inverted insertion. For example, as shown in FIG. 9, grooves 16a and 16b may be formed in the side faces of the cartridge 20 at positions spaced from the centers of the side faces, and cooperating projections 17a and 17b may be formed on the inner side faces of the guide support portions 13b and 13c, respectively. If a user attempts to insert the cartridge upside down, the projections and grooves will not match and insertion will be prevented. Alternately, grooves 16c, 16d and projections 17c and 17d of different widths may be employed, as shown in FIG. 10, or grooves and projections may be formed in the guide supports 13b and 13c and cartridge, respectively.

Figure 2:
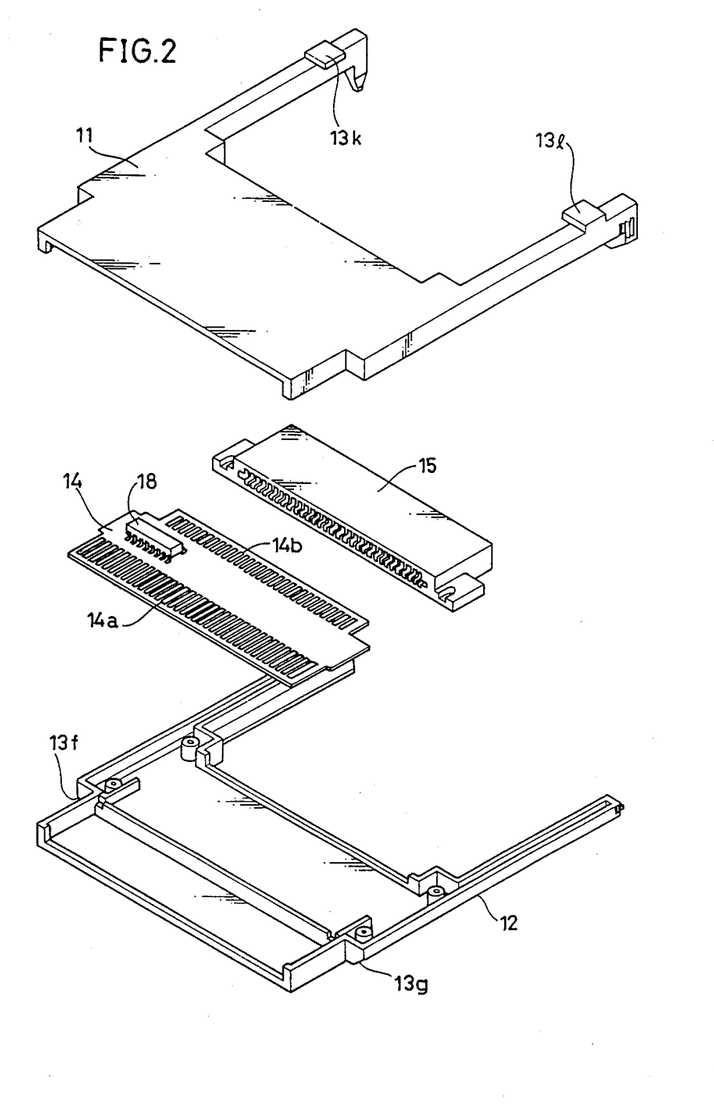
FIG. 2 is a perspective exploded view of the embodiment shown in FIG. 1.
Figure 11:
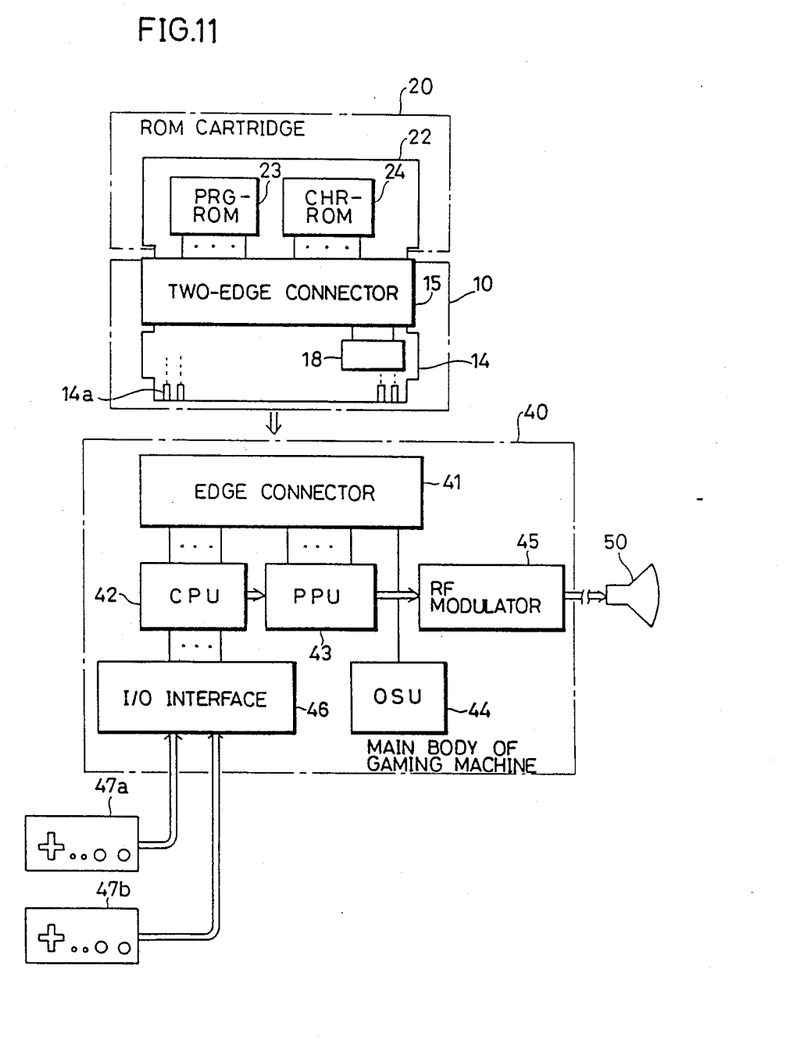
FIG. 11 is a block diagram showing an example of a home television game system using the embodiment shown in FIGS. 1 to 6.

FIG. 11 is a block diagram showing an example of a game system with which the embodiment shown in FIGS. 1 to 6 is used. Referring to FIG. 11, a program ROM 23 and a character ROM 24 are provided on the circuit board 22 of the cartridge 20. A program to be executed in the main body 40 of the gaming machine, namely, software for games and the like is stored in the program ROM 23. Information concerning various characters to be displayed on the home television receiver 50 is stored in the character ROM 24. When the cartridge 20 is inserted in the adaptor 10, output terminals of the program ROM 23 and the character ROM 24 are connected to the second connection terminal group 14b (as shown in FIG. 2) of the connection board 14 through the two-edge connector 15. A signal received by the terminals of the second connection terminal group 14b is subjected to address conversion in an integrated circuit element 18 and an output of the address conversion is supplied to the first connection terminal group 14a. When the adaptor 10 is inserted in the main body 40 of the gaming machine, the first connection terminal group 14a is connected to an edge connector 41. The edge connector 41 is connected to a CPU 42, a PPU (picture processing unit) 43 and an oscillator 44. The CPU 42 controls operation of the internal circuits of the main body 40 of the gaming machine. The PPU 43 performs processing for the picture display based on the information supplied from the CPU 42, and an output of the PPU 43 is supplied to the television receiver 50 through an RF modulator 45. The CPU 42 is connected with an I/O interface 46 for connection with external apparatuses. In this embodiment, game controllers 47a and 47b are connected as external apparatuses. Accordingly, in this case, the CPU 42 controls the proceeding of the game in response to instructions provided from the game controllers 47a, and 47b.

The use of an unauthorized adaptor may be prevented by including a locking circuit in main body 40 and a cooperating program for canceling the lock in integrated circuit element 18 of the adaptor. If this is done, the game may be started only when a compatible adaptor is loaded in the main body 40 of the gaming machine.

Although the above described embodiment permits the use of cartridge 20 in front loading system 1, the present invention may be embodied in an adaptor for permitting the use of cartridge 30 in a vertical loading system, or for providing interchangeability between cartridges of other incompatible loading systems. If cartridges of two different vertical loading systems are interchanged the adaptor should be shaped so that the inserted portion is compatible with the loader of the main body of the gaming machine in which it is to be used.

Although the present invention has been described and illustrated in detail, it is clearly understood that the same is by way of illustration and example only and is not to be taken by way of limitation, the spirit and scope of the present invention being limited only by the appended claims.

What is claimed is:

1. A cartridge adaptor for adapting a memory cartridge configured for use in a first microcomputer gaming machine so that it can be used in a second microcomputer gaming machine that is designed to receive a differently configured cartridge, said adaptor comprising:

a case having a main body and a pair of spaced guide supports extending from the opposing side surfaces of said main body, a space for receiving said memory cartridge defined and partly surrounded by said main body and guide supports, said main body including an insertion portion adapted to be inserted in the second microcomputer gaming machine, and said main body and said guide supports being adapted to receive and support the memory cartridge;

a connection board accommodated within said main body of the case and including a first array of connection terminals associated with the first microcomputer gaming machine, and a second array of connection terminals for cooperating with the second microcomputer gaming machine, and having an edge portion, where the second array of connection terminals is arranged, exposed at said insertion portion of the case;

an edge connector connected to said first array of connection terminals and adapted to connect such terminals to said memory cartridge with said memory cartridge is received and supported by said case.

2. The adaptor of claim 1 wherein the memory cartridge has a pair of opposing side surfaces and wherein said guide supports extend from said main body in a substantially parallel relation and are adapted to slidably engage the side surfaces of the cartridge.

3. The adaptor of claim 1 further including means for preventing said adpator from receiving the cartridge when inverted relative to said adaptor.

4. The adaptor of claim 1 wherein said case includes an upper half and a lower half and means for engaging the two halves.

5. The adaptor of claim 1 wherein said connection board includes address conversion means for performing address conversion between input and output signals of said first and second arrays of connection terminals.

6. A cartridge adaptor for claim 1, wherein said insertion portion of the case has L-shaped step portions formed on both sides in the direction to be inserted in the second microcomputer gaming machine.

7. A cartridge adaptor of claim 1, wherein said memory cartridge has first L-shaped step portions on both sides of a front end and oriented in the direction to be inserted in said memory cartridge receiving space of the case, and said main body of the case has second L-shaped step portions adjacent the junction with said guide supports in the cartridge receiving space to mate with said first step portions.

8. A cartridge adaptor of claim 1 wherein said memory cartridge comprises a circuit board provided with memory for storing program data, and said case is arranged so that said connection board is located in the same plane as an extension of a plane of said circuit board when said circuit board of the memory cartridge is physically and electrically connected by said edge connector.

9. A cartridge adaptor for a gaming machine enabling the use of a cartridge configured for a first gaming machine to be used in a second gaming machine designed to receive a differently configured cartridge, said adaptor comprising:

a case having a main body with opposing side surfaces and a pair of spaced guide supports extending from said side surfaces, a space for receiving said memory cartridge defined and partly surrounded by said main body and guide supports, said main body including an insertion portion adapted to be inserted in the second gaming machine, and said main body and said guide supports being formed to receive and support said cartridge;

a connection board accommodated within said main body of the case and including first and second arrays of connection terminals corresponding to connection terminals of the first and second gaming machines, respectively, and having an edge portion, where the second array of connection terminals is arranged, exposed at said insertion portion of the case;

an edge connector for electrically connecting said first array of connection terminals to the memory cartridge when the memory cartridge is received and supported by said case.

10. The adaptor of claim 9 in which said cartridge has a first major surface and a second major surface opposed to each other, and said adaptor further includes means for preventing the cartridge from being inserted in the adaptor with said first and second major surfaces being reversed in position.

11. The adpator of claim 9 wherein said connection board has first and second opposing edges and wherein the first and second arrays of connection terminals are provided on the first and second edges of said connection board, respectively.

12. A cartridge adaptor for a microcomputer gaming machine enabling the use of a cartridge configured for a first gaming machine to be used in a second gaming machine designed to receive a differently configured cartridge, said adaptor comprising:

a case having an upper half, a lower half and means for engaging the two halves, said case including a main body and a pair of spaced guide supports extending from the main body in a substantially parallel relation, said main body including an insertion portion adapted to be inserted in said second gaming machine, and said main body and said guide supports being adapted to receive and support said cartridge;

a connection board disposed within the case and including first and second arrays of connection terminals, said first array of connection terminals being associated with the first gaming machine, and said second array of connection terminals being of a number and placement for cooperating with the second gaming machine;

an edge connector connected to said first array of connection terminals and adapted to receive said cartridge when said cartridge is installed in the adaptor;

means for preventing said cartridge from being inserted in the adaptor in an inverted orientation relative to said adaptor, said cartridge having a side surface including a tapered portion and said means for preventing including a member on one of said guide supports and cooperating with said tapered surface to prevent the inverted insertion; and, means including a second tapered surface on said main body for preventing the adaptor from being inserted into the second gaming machine in an upside down orientation relative thereto.

13. A cartridge adaptor for an electronic gaming machine enabling the use of a cartridge configured for a first gaming machine to be used in a second gaming machine designed to receive a differently configured cartridge, said adaptor comprising:

a case having an upper half, a lower half and means for engaging the two halves, said case including a main body with opposing side surfaces and a pair of spaced guide supports extending from said opposing side surfaces in a substantially parallel relation, said main body including an insertion portion adapted to be inserted in said second gaming machine, and said main body and said guide supports being adapted to receive and support said cartridge;

a connection board disposed within the case and including first and second arrays of connection terminals associated with the first and second gaming machines, respectively;

an edge connector for electrically connecting said first array of connection terminals to said cartridge when said cartridge is installed in the adaptor;

means for preventing the cartridge from being inserted in the adaptor in an inverted orientation relative to said adaptor, said cartridge having a second side surface including a tapered portion and said means for preventing including a member attached to one of said guide supports and cooperating with said tapered surface to prevent the inverted insertion; and, means for preventing the adaptor from being inserted into the second gaming machine in an upside down orientation relative thereto, said means including a tapered surface adjoining one of said opposing side surfaces and extending along one of said guide supports.

14. A cartridge adaptor for a memory cartridge that is configured with opposing sides, one of which has a tapered portion, for use in a first microcomputer gaming machine, adapting it for use in a second microcomputer gaming machine that is designed to receive a differently configured cartridge, said adaptor comprising:

a case having a main body and a pair of spaced guide supports extending from said main body, said main body including an insertion portion adapted to be inserted in the second microcomputer gaming machine, and said main body and said guide supports being adapted to receive and support the memory cartridge;

said case further including means for preventing said adaptor from receiving the memory cartridge when inverted relative to said adaptor, said means for preventing includes a taper on one of said guide supports that cooperates with the tapered portion on one of said sides of the memory cartridge;

a connection board disposed within said case and including a first array of connection terminals associated with the first microcomputer gaming machine, and a second array of connection terminals for cooperating with the second microcomputer gaming machine; and an edge connector connected to said first array of connection terminals and adapted to connect such terminals to said memory cartridge when said memory cartridge is received and supported by said case.

15. A cartridge adaptor for a memory cartridge configured for use in a first microcomputer gaming machine so that it can be used in a second microcomputer gaming machine that is designed to receive a differently configured cartridge, said adaptor comprising:

a case having a main body and a pair of spaced guide supports extending from said main body, said main body including an insertion portion adapted to be inserted in the second microcomputer gaming machine, and said main body and said guide supports being adapted to receive and support the memory cartridge;

said main body having a topside and further including means in the form of a tapered surface for preventing said adaptor from being inserted into the second microcomputer gaming machine with said topside facing down;

a connection board disposed within said case and including a first array of connection terminals associated with the first microcomputer gaming machine, and a second array of connection terminals for cooperating with the second microcomputer gaming machine; and an edge connector connected to said first array of connection terminals and adapted to connect such terminals to said memory cartridge when said memory cartridge is received and supported by said adaptor.

16. The adaptor of claim 15 wherein said main body further includes a side surface and said tapered surface extends between said top and side surfaces.

17. The adapter of claim 16 wherein said tapered surface also extends along one of said guide supports.

* * * * *